United States Patent [19]

Kanjolia et al.

[11] Patent Number: 4,999,223

[45] Date of Patent: Mar. 12, 1991

[54] CHEMICAL VAPOR DEPOSITION AND CHEMICALS WITH DIARSINES AND POLYARSINES

[75] Inventors: Ravi K. Kanjolia, North Andover; Benjamin C. Hui, Peabody, both of Mass.

[73] Assignee: CVD Incorporated, Woburn, Mass.

[21] Appl. No.: 484,720

[22] Filed: Feb. 22, 1990

[51] Int. Cl.$^5$ .................. B05D 5/12; C23C 16/18; C23C 16/30

[52] U.S. Cl. .................. 427/252; 427/255.2; 437/81; 437/133; 156/613; 556/64; 556/65; 556/70

[58] Field of Search .................. 427/255, 255.1, 255.2, 427/250, 248.1, 252; 556/64, 65, 70; 437/81, 133; 156/613

[56] References Cited

U.S. PATENT DOCUMENTS

| | | | |
|---|---|---|---|
| 3,867,202 | 2/1975 | Ichiki et al. | 437/107 |
| 4,611,071 | 9/1986 | De Priest | 556/70 |
| 4,721,683 | 1/1988 | Ward | 427/38 |
| 4,857,655 | 8/1989 | Valentine, Jr. | 556/70 |
| 4,900,855 | 2/1990 | Hui et al. | 556/70 |
| 4,904,616 | 2/1990 | Bohling et al. | 437/81 |
| 4,906,762 | 3/1990 | Sawara et al. | 556/70 |

OTHER PUBLICATIONS

Speckman et al, *Appl. Phys. Lett.*, vol. 50, No. 11, Mar. 16, 1987, pp. 676–678.

Lum et al., *Applied Phys. Lett.*, vol. 50, No. 5, Feb. 2, 1987, pp. 284–286.

*Dictionary of Organometallic Compounds*, vol. 1, (Chapman & Hall, London), c. 1984, pp. 139, 152.

Wilkinson et al., Eds., *Comprehensive Organometallic Chemistry*, vol. 2, (Pergamon Press, Oxford) c. 1982, pp. 681, 702–703.

*Primary Examiner*—Norman Morgenstern
*Assistant Examiner*—Margaret Bueker
*Attorney, Agent, or Firm*—Wayne E. Nacker; Gerald K. White

[57] ABSTRACT

A MOCVD process for depositing an arsenic-containing film utilizes an organoarsine compound having at least one As-As bond, in particular, diarsines and compounds having arsenic rings of 5 or 6 arsenic atoms.

3 Claims, No Drawings

CHEMICAL VAPOR DEPOSITION AND CHEMICALS WITH DIARSINES AND POLYARSINES

The present invention is directed to chemical vapor deposition and chemical doping with the novel use of diarsines and polyarsine compounds.

BACKGROUND OF THE INVENTION

Metal organic chemical vapor deposition (MOCVD) for producing III-V films on various substrates are well known and well documented in the literature. A few references to this subject, all disclosures of which are incorporated herein by reference, include U.S. Pat. Nos. 3,101,280, 3,218,203, 3,224,913, 3,226,270, 3,261,726, 3,312,570, 3,312,571, 3,342,551, 3,364,084, 4,368,098, and 4,404,265.

Chemical doping of materials, particularly semiconductor materials, is carried out in a similar manner to epitaxial growth of films by MOCVD. However, in doping, the substrate material is placed in the reaction chamber and lower levels of the metal-yielding compound are introduced.

Arsine ($AsH_3$) had been the standard arsenic source for MOCVD processes for epitaxial growth films, such as III-V films. However, due to the hazard posed by this toxic and gaseous material, substitutes for arsine are sought for MOCVD processes as well as arsenic doping processes.

As an alternative to arsine, alkyl arsines have been used in MOCVD and doping processes. Initially, trialkyl arsines were tried. While these compounds are less hazardous than arsine, they have the disadvantage of tending to deposit carbon along with the metals. Accordingly, dialkyl arsines and monoalkyl arsines are finding favor for MOCVD and doping processes, as described, for example in U.S. Pat. Nos. 4,734,514 and 4,814,203, the teachings of which are incorporated herein by reference.

A further difficulty with known arsenic compounds when forming III-V films is that although the metal molar ratio of arsenic to the metal of group III metal compounds, e.g., Ga, is 1:1; a huge excess of arsenic compound relative to gallium compound must be passed through the reactor. When using arsine, it must be supplied at a molar ratio of about 100:1 relative to a gallium compound. When using an alkyl arsine, the molar ratio is still about 30:1. It would be desirable to reduce this ratio.

It is further desirable that the arsenic-containing compound introduced into the reaction chamber contain a high percentage of arsenic.

SUMMARY OF THE INVENTION

In accordance with the invention, diarsines and polyarsines are used for MOCVD in epitaxial growth and in chemical doping. These compounds provide a high weight percentage of arsenic per weight of the molecule.

DETAILED DESCRIPTION OF CERTAIN PREFERRED EMBODIMENTS

In accordance with the invention, diarsines and polyarsines are used for MOCVD and for chemical doping. By diarsine and polyarsine is meant a compound containing at least one As-As bond. In particular, compounds of the following general formula are used for MOCVD or chemical doping:

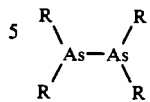  I.

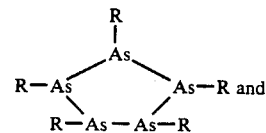  II.

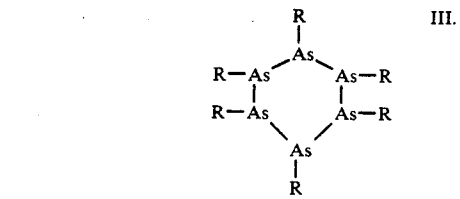  III.

wherein the R's are the same or different selected from alkyl, alkene and alkyne.

Suitable chemicals within these general formulae are liquid at a temperature whereat they are stable against decomposition and from which they can be vaporized, e.g., by bubbling carrier gas therethrough, for transport into a deposition chamber. At such temperature, the compounds should have a sufficiently high vapor pressure for the intended use. For epitaxial growth by MOCVD, it is preferred that the compound have a vapor pressure of at least 1 torr at the vaporizing temperature. For chemical doping, the vapor pressure may be considerably less.

Generally, the lower the molecular weight of the R groups, the higher the vapor pressure of the diarsines and polyarsine, although other factors, such as the symmetry or asymmetry of the molecule may affect this.

Accordingly, the R groups of compounds of formulae I-IV should average 3 or less carbon atoms. Preferably, no R group has more than 3 carbon atoms.

Example of suitable compounds include but are not limited to:

| Compounds | B.P. or Vapor Pressure |
|---|---|
| $Me_2AsAsMe_2$ | 60° C./25 mm; B.P. 163° C. |
| $Et_2AsAsEt_2$ | 185° C. |
| $(MeAs)_5$ | 178° C./15 Torr |
| $(EtAs)_5$ | 190° C./1 Torr |
| $(n\text{-}PrAs)_5$ | 144° C./0.05 Torr |

Mixtures of diarsines and/or polyarsines may also be used, but mixtures are problematic for lack of a consistant vapor pressure throughout a deposition.

These organo-arsines are substantially less hazardous than arsine. Furthermore, due to the As-As bonds, the arsenic, as a weight percent of the total compound, is high.

Other advantages are expected as well. Some spectral data indicate that when arsine is used as the source of arsenic, As-As bonded species form at the decomposition temperatures; and it is believed that such species may be intermediate precursors to deposition of arsenic. With diarsines and polyarsines, the As-As bonds are already formed.

It is further believed that the di-and poly-arsines may pre-bond or pre-coordinate with Group III metals of Group III metal compounds. For example, it is believed that the diarsines form adducts with $R_3Al$ and $R_3Ga$ compounds in which at least one of the R's is a hydrocarbon. It is also believed that $R_3Ga$ compounds form $R_2Ga^+$ and $R_2Ga$: species and that the relatively low energy of dissociation of the As-As bonds into ions or free radicals would promote bonding of the As to Ga prior to deposition and thereby reduce the As:Ga molar ratio required for forming GaAs films.

The invention will now be described in greater detail by way of specific examples.

EXAMPLE 1

MOCVD Process

Tetraethylbiarsine is placed in a bubbler and suitably interconnected with a source of hydrogen gas and a deposition chamber. The chamber is also supplied with trimethylgallium contained in a separate bubbler. The biarsine bubbler is maintained at 50° C., using suitable heating or cooling devices. The deposition chamber is maintained at $-5°$ C., using suitable heating or cooling devices. The deposition chamber is maintained at 650° C., and a gallium arsenide substrate is supported within the deposition chamber. The entraining hydrogen is delivered at about 5 to 10 liters per minute (at standard temperature and pressure). The partial pressure of hydrogen in the deposition chamber is atmospheric pressure, and the partial pressure of the tetraethylbiarsine is about 15 torrs, the partial pressure of trimethylgallium is about 45 torrs. Deposition of gallium arsenide of various thickness is found on the substrate.

EXAMPLE 2

Polyarsine as Dopant

Arsenic-dope mercury cadmium telluride layers are grown in an atmospheric pressure reactor using diisopropyl telluride, dimethylcadmium, and elemental mercury. Pentaethyl pentaarsine kept in a blubbler at about 50° C. is used as a dopant source. The subtrate used is semi-insulating gallium arsenide and the growth temperature is about 350° C. Hydrogen is used as a carrier gas.

While the invention has been described in terms of certain preferred embodiments, modifications obvious to one with ordinary skill in the art may be made without departing from the scope of the present invention.

Various features of the invention are set forth in the following claims.

What is claimed is:

1. In a process for vapor deposition for producing an arsenic-containing film on a substrate by thermally decomposing a vaporous organo arsenic compound on a heated substrate or a chemical doping process in which an organo arsenic compound is used to introduce arsenic atoms into a substrate, the improvement comprising said organo arsenic compound being a diarsine or a polyarsine having As-As bonds.

2. A process according to claim 1 wherein said organo arsenic compound has a formula selected from:

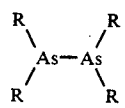 I.

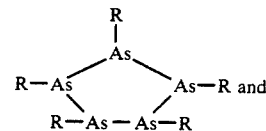 II.

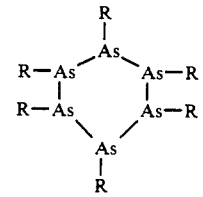 III.

wherein the R substituents are the same or different and are selected from the group consisting of alkyl, alkene, and alykne.

3. A process according to claim 1 wherein said oragno arsenic compound is selected from the group consisting of compounds $Me_2AsAsMe_2$, $Et_2AsAsEt_2$, $(MeAs)_5$, $(EtAs)_5$, and $(n-PrAs)_5$.

* * * * *